United States Patent
Onaka et al.

(10) Patent No.: US 11,982,525 B2
(45) Date of Patent: May 14, 2024

(54) MAGNETIC SENSOR UNIT

(71) Applicant: Panasonic Intellectual Property Management Co., Ltd., Osaka (JP)

(72) Inventors: Kazuhiro Onaka, Hyogo (JP); Kiyotaka Yamada, Osaka (JP); Noritaka Ichinomiya, Nara (JP); Shigehiro Yoshiuchi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 230 days.

(21) Appl. No.: 17/295,425

(22) PCT Filed: Jul. 5, 2019

(86) PCT No.: PCT/JP2019/026875
§ 371 (c)(1),
(2) Date: May 19, 2021

(87) PCT Pub. No.: WO2020/121566
PCT Pub. Date: Jun. 18, 2020

(65) Prior Publication Data
US 2022/0011086 A1     Jan. 13, 2022

(30) Foreign Application Priority Data

Dec. 14, 2018 (JP) ................... 2018-234033
Dec. 27, 2018 (JP) ................... 2018-244045

(51) Int. Cl.
*G01B 7/30* (2006.01)
*G01R 33/09* (2006.01)

(52) U.S. Cl.
CPC ............. *G01B 7/30* (2013.01); *G01R 33/091* (2013.01); *G01R 33/093* (2013.01); *G01R 33/096* (2013.01); *G01R 33/098* (2013.01)

(58) Field of Classification Search
CPC .................. G01R 33/091; G01B 7/30
See application file for complete search history.

(56) References Cited

U.S. PATENT DOCUMENTS

| 10,759,276 | B2 * | 9/2020 | Onaka | G01R 33/09 |
|---|---|---|---|---|
| 2011/0080162 | A1 | 4/2011 | Steinich et al. | |
| 2016/0033305 | A1 * | 2/2016 | Mehnert | G01D 5/2216 |
| | | | | 324/207.18 |

FOREIGN PATENT DOCUMENTS

| JP | 2-099823 | 4/1990 |
|---|---|---|
| JP | 2007-263585 | 10/2007 |
| WO | 2013/145644 | 10/2013 |

OTHER PUBLICATIONS

International Search Report of PCT application No. PCT/JP2019/026875 dated Sep. 24, 2019.

* cited by examiner

*Primary Examiner* — Reena Aurora
(74) *Attorney, Agent, or Firm* — Rimon P.C.

(57) ABSTRACT

A magnetic sensor unit includes a magnet, a magnetic sensor facing a lower surface of the magnet, a magnetic shield surrounding the magnetic sensor in a lateral direction crossing up and down directions of the magnetic sensor, and a magnetic yoke covering an upper surface and a side surface of the magnet. The magnet includes a first magnetized region magnetized along the up and down direction, and a second magnetized region magnetized in a direction opposite to a direction of magnetization of the first magnetized region. The first and second magnetized regions have first and second magnetic poles provided on the lower surface of the magnet. A distance LA between a center of the first magnetic pole and a center of the second magnetic pole, a distance LB between the magnetic shield and the center of the first magnetic pole, a distance LC between the magnetic (Continued)

shield and the center of the second magnetic pole satisfy a relation of LA<LB+LC. This magnetic sensor unit has magnetic shielding properties and has a small size.

12 Claims, 10 Drawing Sheets

FIG. 13

MAGNETIC SENSOR UNIT

CROSS-REFERENCE TO RELATED APPLICATIONS

This application is a U.S. national stage application of the PCT international application No. PCT/JP2019/026875 filed on Jul. 5, 2019, which claims the benefit of foreign priority of Japanese patent application No. 2018-234033 filed on Dec. 14, 2018 and Japanese patent application No. 2018-244045 filed on Dec. 27, 2018, the contents all of which are incorporated herein by reference.

TECHNICAL FIELD

The present disclosure relates to a magnetic sensor unit configured to detect a rotation angle of a rotation shaft.

BACKGROUND ART

A magnetic sensor unit for detecting a rotation angle of a rotation includes a magnetic shield suppressing an effect of an external magnetic field. For example, PTL 1 discloses a magnetic yoke disposed on a magnet to increase magnetic flux density and obtain a magnetic shield effect. PTL 2 discloses a shield case for covering a magnet and a magnetic sensor.

CITATION LIST

Patent Literature

PTL 1: Japanese Patent Laid-Open Publication No. 2007-263585

PTL 2: Japanese Patent Laid-Open Publication No. H02-99823

SUMMARY

A magnetic sensor unit includes a magnet, a magnetic sensor facing a lower surface of the magnet, a magnetic shield surrounding the magnetic sensor in a lateral direction crossing up and down directions of the magnetic sensor, and a magnetic yoke covering an upper surface and a side surface of the magnet. The magnet includes a first magnetized region magnetized along the up and down direction, and a second magnetized region magnetized in a direction opposite to a direction of magnetization of the first magnetized region. The first and second magnetized regions have first and second magnetic poles provided on the lower surface of the magnet. A distance LA between a center of the first magnetic pole and a center of the second magnetic pole, a distance LB between the magnetic shield and the center of the first magnetic pole, a distance LC between the magnetic shield and the center of the second magnetic pole satisfy a relation of LA<LB+LC.

This magnetic sensor unit has magnetic shielding properties and has a small size.

DETAIL DESCRIPTION OF PREFERRED EMBODIMENT

Hereinafter, a magnetic sensor unit according to an exemplary embodiment of the present disclosure will be described with reference to the drawings. Note that each exemplary embodiment described below shows one specific preferred example of the present disclosure. Thus, the shapes, the structural elements, the arrangement and connection of the structural elements, etc., shown in the following exemplary embodiment are mere examples, and are not intended to limit the present disclosure. As such, among the structural elements in the following exemplary embodiment, structural elements not recited in the independent claim which indicates the broadest concepts of the present invention are described as arbitrary structural elements.

Note that the figures are schematic diagrams and are not necessarily precise illustrations. In the respective figures, substantially identical elements are assigned the same reference marks, and overlapping description is omitted or simplified.

Figure 1:
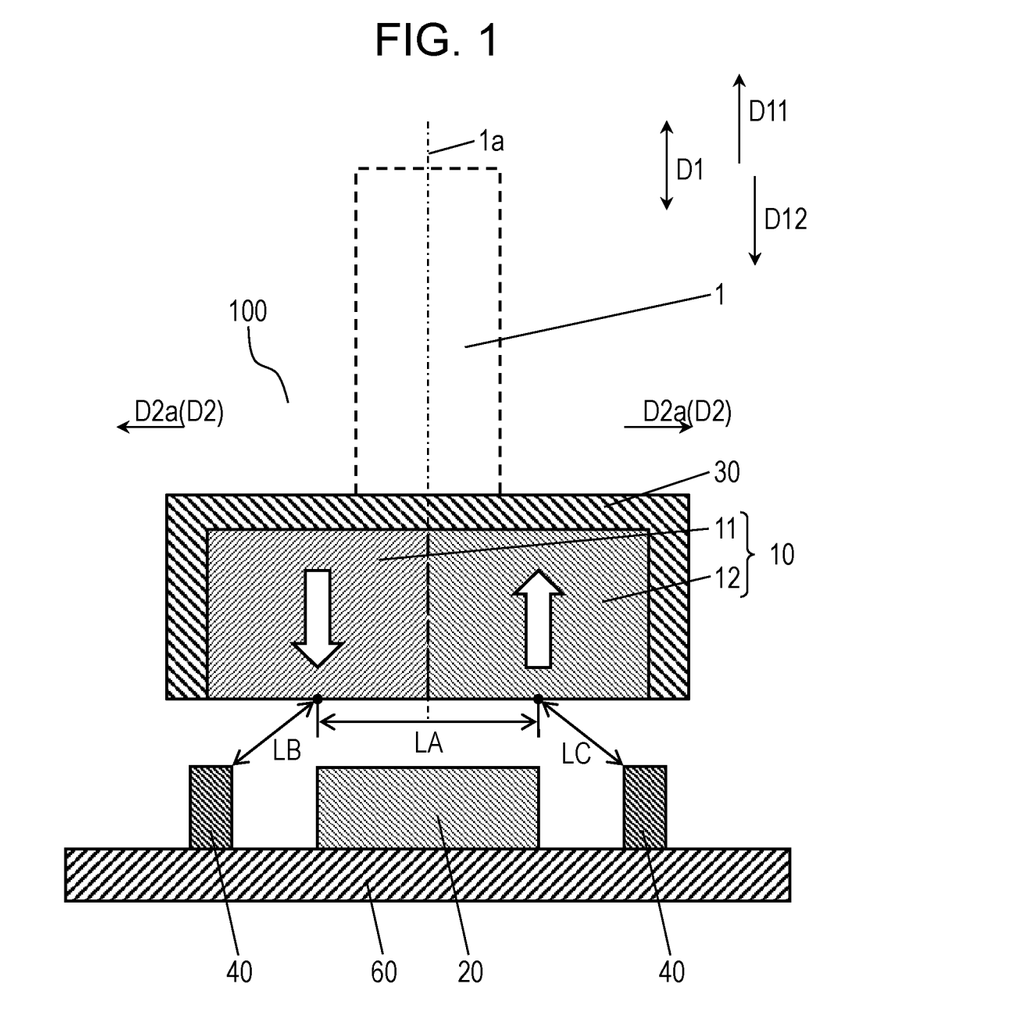
FIG. 1 is a schematic cross-sectional view of a magnetic sensor unit according to an exemplary embodiment.

FIG. 1 is a cross-sectional view of a magnetic sensor unit according to an exemplary embodiment. Magnetic sensor unit 100 includes magnet 10, magnetic sensor 20, magnetic yoke 30, and magnetic shield 40. Magnet 10 is connected to the tip of rotation shaft 1 extended along rotation axis 1a extended in up and down directions D1, and is rotatable together with rotation shaft 1. Magnetic sensor 20 detects the direction of a target magnetic field which is a magnetic field generated by magnet 10 in a detection region located between magnet 10 and magnetic sensor 20. Magnetic shield 40 blocks an external magnetic field acting thereon from outside of magnetic sensor unit 100 so as to prevent the external magnetic field from passing through magnetic shield 40 and reaching magnetic sensor 20. Magnetic yoke 30 increases the density of magnetic flux in magnet 10 applied to magnetic sensor 20.

Figure 2:
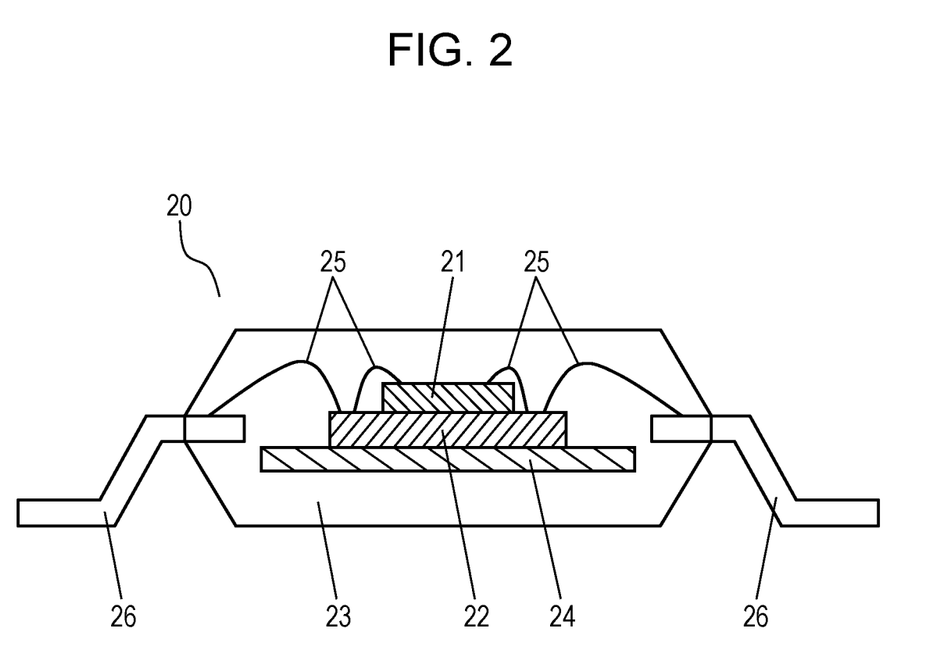
FIG. 2 is a cross-sectional view of a magnetic sensor of the magnetic sensor unit according to the embodiment.

FIG. 2 is a cross-sectional view of magnetic sensor 20. Magnetic sensor 20 includes magnetoresistive element 21 and circuit element 22. FIG. 2 illustrates a structure of magnetic sensor 20 in which magnetoresistive element 21 and circuit element 22 are disposed inside resin molded body 23 and are integrated. Circuit element 22 is mounted on die pad 24. Magnetoresistive element 21 is mounted on circuit element 22. Magnetoresistive element 21 is electrically connected to circuit element 22 with bonding wire 25. Circuit element 22 is connected to lead 26 with bonding wire 25.

Figure 3:
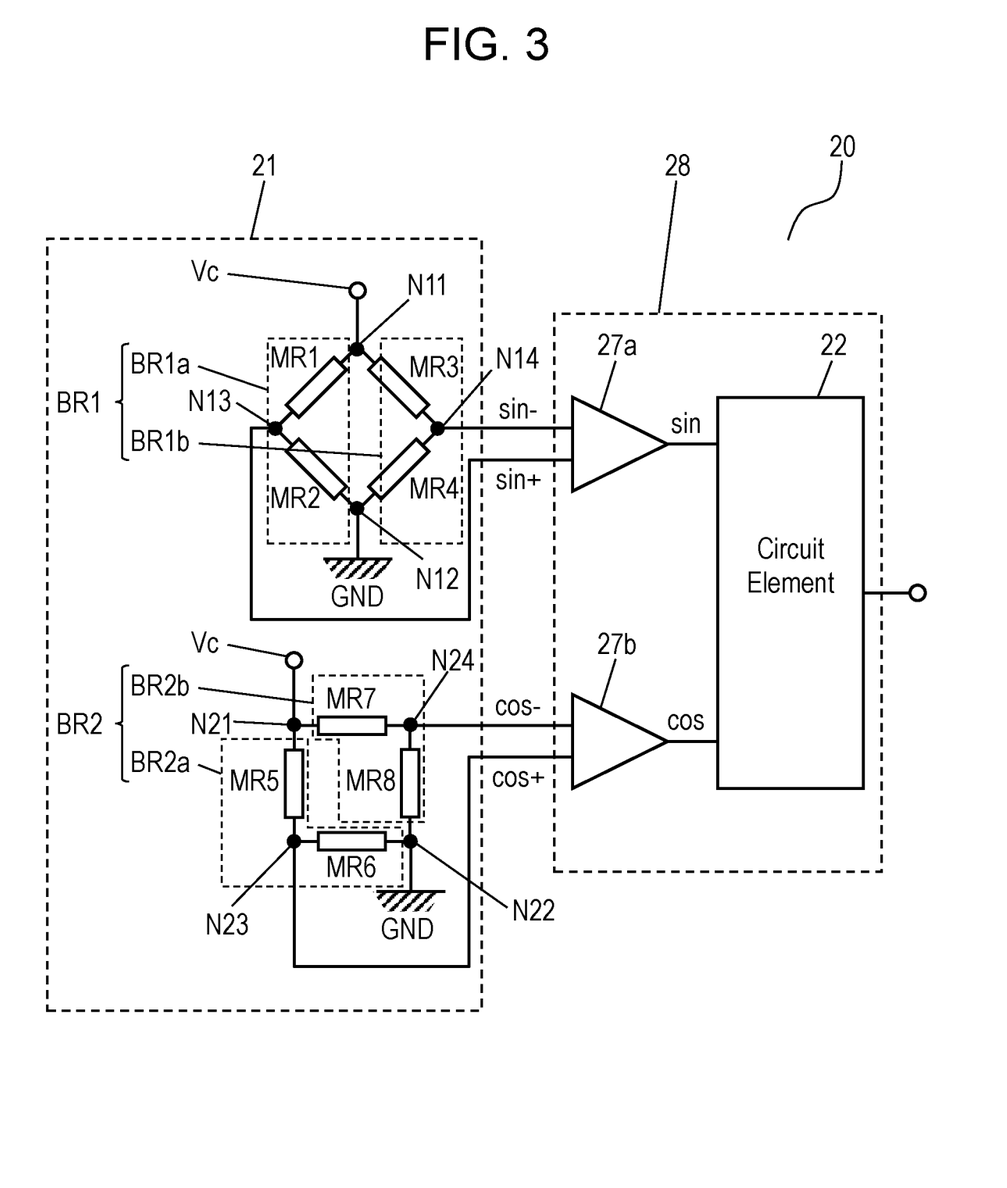
FIG. 3 is a block diagram of a circuit block of the magnetic sensor illustrated in FIG. 2.
Figure 4:
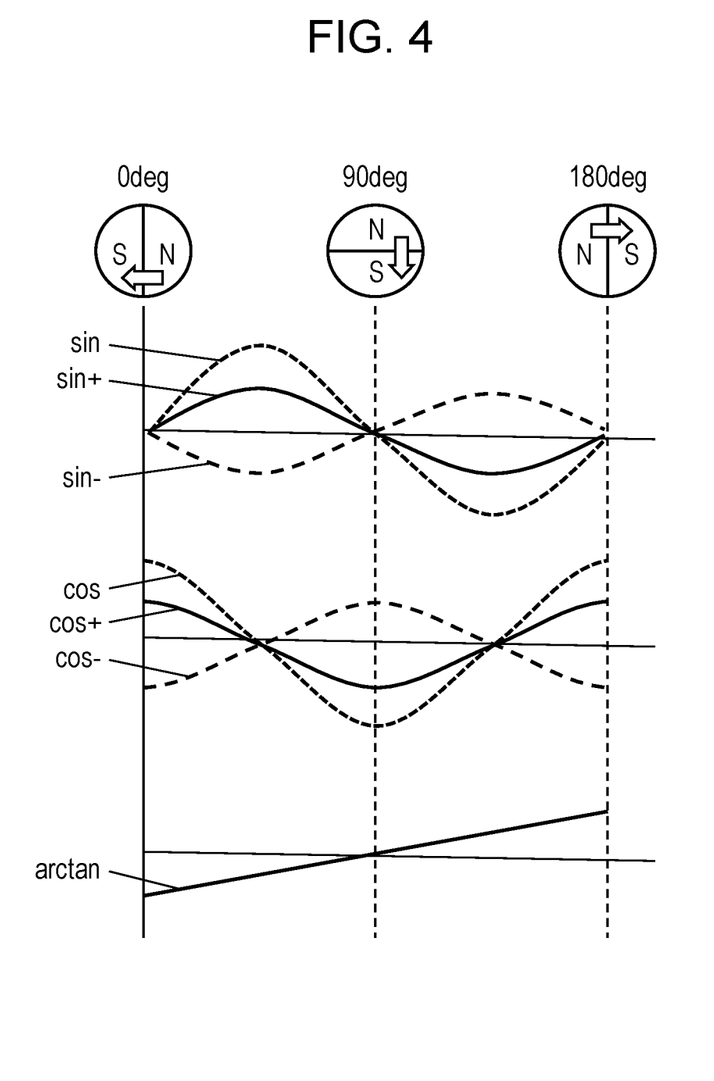
FIG. 4 illustrates a signal processing operation of a control circuit of the magnetic sensor illustrated in FIG. 2.

FIG. 3 is a block diagram of a circuit block of magnetic sensor 20. FIG. 4 illustrates a signal processing operation of the circuit block. Magnetoresistive element 21 includes bridge circuit BR1 and bridge circuit BR2 which include magnetoresistors MR1 to MR8. Magnetoresistors MR1 to MR8 have electrical resistance depending on magnetic fields applied thereto. Bridge circuits BR1 and BR2 are Wheatstone bridge circuits. Bridge circuit BR1 includes series assembly BR1a and series assembly BR1b. Series assembly BR1a includes magnetoresistors MR1 and MR2 connected in series to each other at node N13. Series assembly BR1b includes magnetoresistors MR3 and MR4 connected in series to each other at node N14. Series assemblies BR1a and BR1b are located between nodes N11 and N12 and connected in parallel to each other at nodes N11 and N12. Bridge circuit BR2 includes series assembly BR2a and series assembly BR2b. Series assembly BR2a includes magnetoresistors MR5, MR6 connected in series to each other at node N23. Series assembly BR2b includes magnetoresistors MR7 and MR8 connected in series to each other at node N24. Series assemblies BR2a and BR2b are located between nodes N21 and N22 and connected in parallel to each other at nodes N21 and N22. Nodes N11 and N21 are connected to reference potential Vc, and nodes N12 and N22 are connected to the ground (GND). Magnetoresistors MR1 to MR8 are made of anisotropic magnetoresistors. The anisotropic magnetoresistors may be made of metal patterns containing iron-nickel alloy and having magnetoresistive effects. The electrical resistance of the anisotropic magnetoresistors depends on the direction and magnitude of the target magnetic field. Circuit element 22 detects potentials at nodes N13 and N14 of bridge circuit BR1 and potentials at nodes N23 and N24 of bridge circuit BR2.

Magnetic sensor 20 may include only one of series assembly BR1a or series assembly BR1b instead of bridge circuit BR1. Magnetic sensor 20 may include only one of series assembly BR2a or series assembly BR2b instead of bridge circuit BR2. For example, in the case where magnetic sensor 20 includes none of series assemblies BR1b and BR2b, but includes series assemblies BR1a and BR2a, circuit element 22 detects potentials at nodes N13 and N23.

A magnetic sensor employing an anisotropic magnetoresistor is capable of detecting larger magnetic field than a magnetic sensor employing other elements. As the magnetic field strength increases, this magnetic sensor removes distortion of an output waveform and provides detected electrical signals with values closer to an ideal value. Therefore, in a region having relatively high magnetic field strength, a magnetic sensor employing anisotropic magnetoresistance (AMR) has higher angle detection accuracy than a magnetic sensor employing a giant magnetoresistive (GMR) element, a magnetic sensor employing a tunnel magnetoresistive (TMR) element, and a magnetic sensor employing a Hall element.

Figure 5:
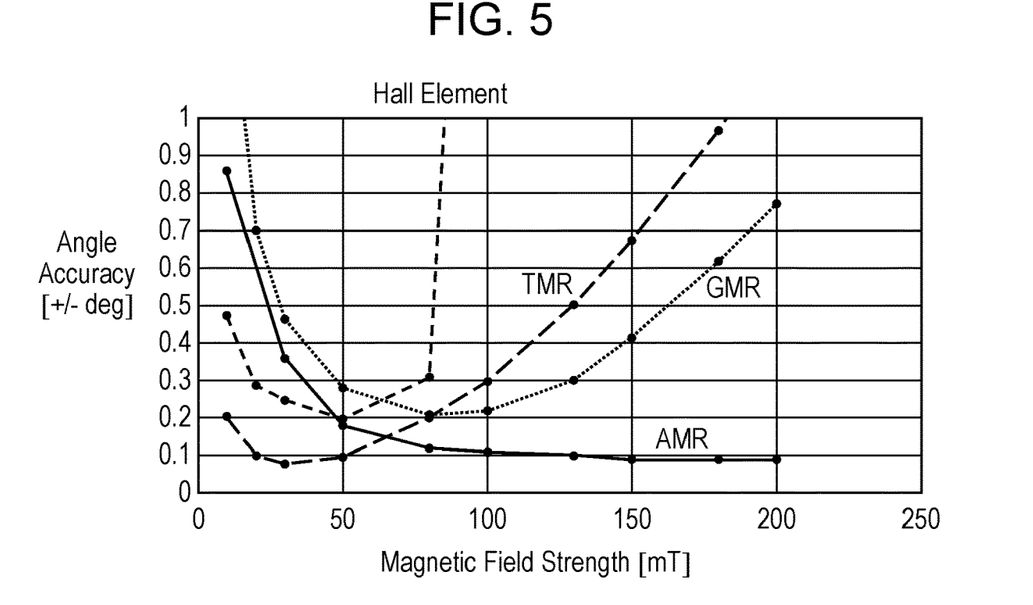
FIG. 5 illustrates the relationship between magnetic field strength and angle accuracy of various magnetic sensors.

FIG. 5 illustrates the relationship between the strength of magnetic fields applied to magnetic sensors employing different types of elements and the detected angle accuracy of the magnetic sensors. As illustrated in FIG. 5, the detected angle accuracy of the magnetic sensor employing an AMR element increases as the magnetic field strength increases. The detected angle accuracy of the magnetic sensor employing a GMR element decreases with magnetic field strength equal to or larger than of 80 mT. This is because a magnetic field strength region in which a pin layer of GMR acts ideally ranges from 60 mT to 80 mT. The detected angle accuracy of the magnetic sensor employing a TMR element decreases with magnetic field strength equal to or larger than of 80 mT. This is because a magnetic field strength region in which a pin layer of TMR acts ideally ranges from 30 mT to 50 mT. The magnetic sensor employing a Hall element requires a multi-stage amplification process due to its small detection output. This causes an issue of great variation in measurement angle with respect to fluctuation of the target magnetic field. The magnetic sensor employing an anisotropic magnetoresistors allows the target magnetic field to be large, and relatively reduced the effects of disturbance magnetic fields accordingly. As a result, the magnetic sensor accurately detects magnetic field with large an S/N ratio.

In bridge circuit BR1, the series assembly of magnetoresistors MR1 and MR2 and the series assembly of magnetoresistors MR3 and MR4 are connected in parallel to each other between reference potential Vc and ground GND. A midpoint potential, specifically, the potential at node N13, is output from the node between magnetoresistors MR1 and MR2 as detection signal sin+. A midpoint potential, specifically, the potential at node N14, is output from the node between magnetoresistors MR3 and MR4 as detection signal sin−.

In bridge circuit BR2, the series assembly of magnetoresistors MR5 and MR6 and the series assembly of magnetoresistors MR7 and MR8 are connected in parallel to each other between reference potential Vc and ground GND. A midpoint potential, specifically, the potential at node N23, is output from the node between magnetoresistors MR5 and MR6 as detection signal cos+. A midpoint potential, specifically, the potential at node N24, is output from the node between magnetoresistors MR7 and MR8 as detection signal cos−.

Bridge circuit BR1 and bridge circuit BR2 are disposed such that the phase of detection signal cos+ shifts from that of detection signal sin+ by 90 degrees and the phase of detection signal cos− shifts from that of detection signal sin− by 90 degrees for the rotation of the target magnetic field.

Circuit element 22 includes differential amplifiers 27a and 27b and processor 28. Circuit element 22 will be described only about a minimum configuration to describe the present disclosure; the present disclosure is not limited to this configuration.

Signal sin+ and signal sin− output from bridge circuit BR1 are input to differential amplifier 27a. Differential amplifier 27a generates amplified signal sin from signal sin+ and signal sin− received, and outputs amplified signal sin. In accordance with the embodiment, differential amplifier 27a generates amplified signal sin by subtracting signal sin− from signal sin+ and defining the obtained difference as amplified signal sin.

Signal cos+ and signal cos− output from bridge circuit BR2 are input to differential amplifier 27b. Differential amplifier 27b generates amplified signal cos from signal cos+ and signal cos− received, and outputs amplified signal cos. In accordance with the embodiment, differential amplifier 27b generates amplified signal cos by subtracting signal cos− from signal cos+ and defining the obtained difference as amplified signal cos.

Signal sin output from differential amplifier 27a and signal cos output from differential amplifier 27b are input to processor 28. Processor 28 performs an arctangent operations on the received signal sin and signal cos. Processor 28 outputs signal arctan resulting from the arctangent operations. In accordance with the embodiment, processor 28 outputs, as signal arctan, a quotient obtained by dividing signal cos by signal sin. In magnetic sensor 20, signal arctan is output from circuit element 22. Signal arctan includes rotation information including the rotation angle of magnet 10.

Figure 6:
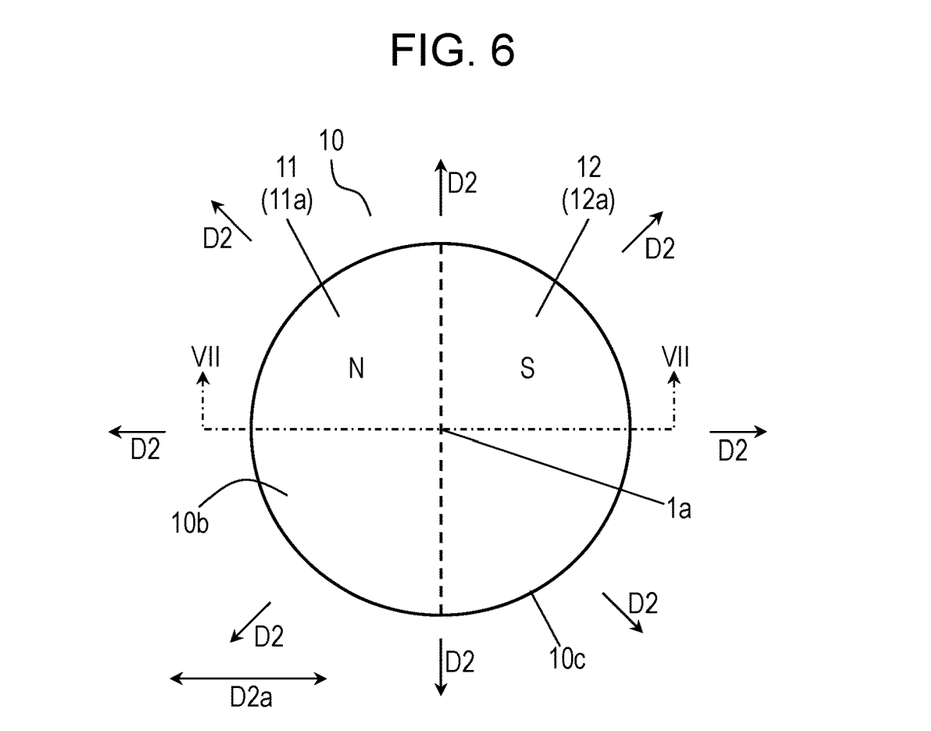
FIG. 6 is a bottom view of a magnet of the magnetic sensor unit according to the embodiment.
Figure 7:
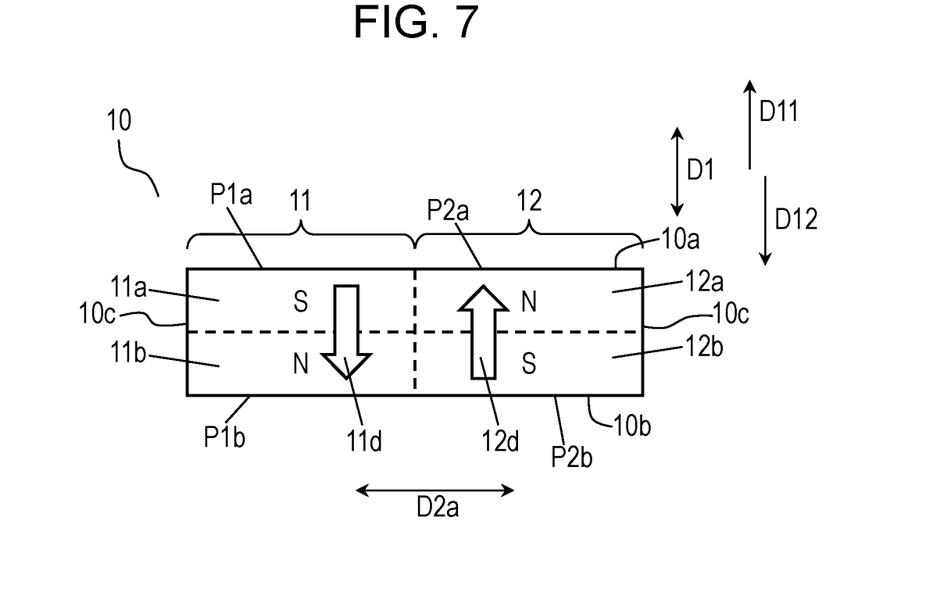
FIG. 7 is a cross-sectional view of the magnet illustrated along line VII-VII shown in FIG. 6.

FIG. 6 is a bottom view of magnet 10. FIG. 7 is a cross-sectional view of magnet 10 illustrated along line VII-VII shown in FIG. 6. Magnet 10 includes a permanent magnet having a disk shape having upper surface 10a and lower surface 10b with circular shapes. Magnet 10 further has side surface 10c connected to upper surface 10a and lower surface 10b and surrounding respective entire perimeters of upper surface 10a and lower surface 10b. Magnet 10 includes magnetized region 11 and magnetized region 12 connected to magnetized region 11. Magnetized region 11 is a semicircular portion that is one of the two halves of magnet 10 when viewed from above. Magnetized region 12 is a semicircular portion that is the other of the two halves of magnet 10 when viewed from above. Magnetized regions 11 and 12 are arranged in arrangement direction D2a perpendicular to up and down directions D1.

Magnetized region 11 is magnetized in magnetization direction 11d which is downward direction D12 out of up and down directions D1. Upper region 11a of magnetized region 11 is an S-pole, and lower region 11b of magnetized region 11 is an N-pole.

Magnetized region 12 is magnetized in magnetization direction 12d which is upward direction D11 out of up and down directions D1. Magnetization direction 12d of magnetized region 12 is opposite to magnetization direction 11d of magnetized region 11. Lower region 12b of magnetized region 12 is an S-pole, and upper region 12a of magnetized region 12 is an N-pole. These regions are separated by the dashed line in the figure, but are separated according to the distribution of magnetic poles. As illustrated in FIG. 7, magnetized region 11 includes magnetic pole P1b which is an N-pole, on lower surface 10b of magnet 10. Magnetized region 12 includes magnetic pole P2b, which is an S-pole, an opposite polarity to magnetic pole P1b, on lower surface 10b of magnet 10. Similarly, magnetized region 11 includes magnetic pole P1a, which is an S-pole, on upper surface 10a of magnet 10. Magnetized region 12 includes magnetic pole P2a, which is an N-pole, an opposite polarity to magnetic pole P1a, on upper surface 10a of magnet 10.

Figure 8:
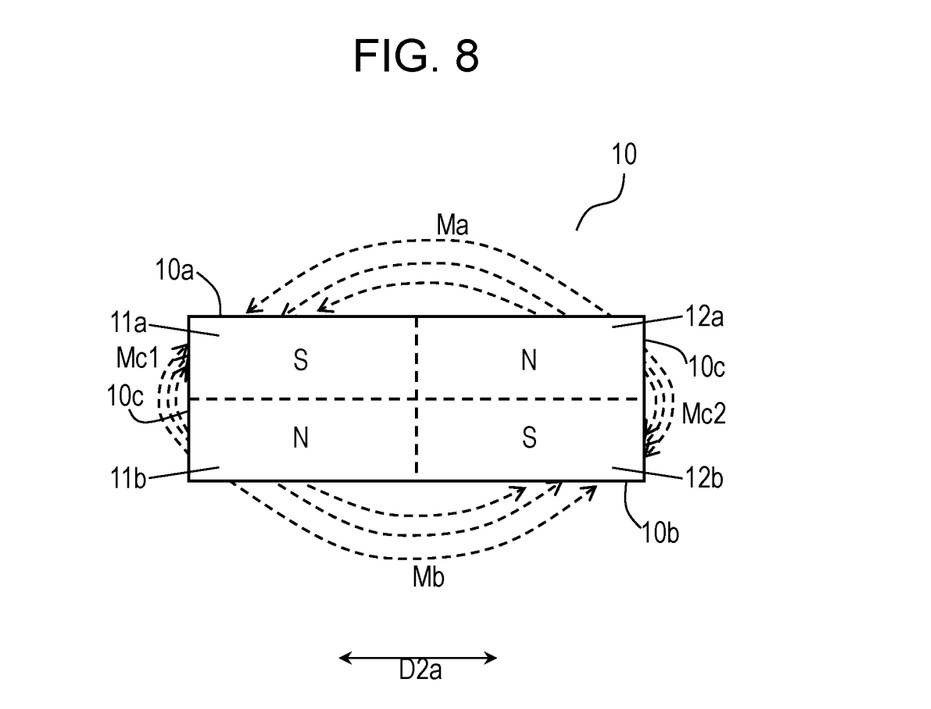
FIG. 8 illustrates a magnetic field distribution of the magnet according to the embodiment.

FIG. 8 illustrates the magnetic field distribution of magnet 10. Magnetic field line Ma on the upper surface of magnet 10 in the figure is extended from magnetic pole P2a of region 12a in magnetized region 12 to magnetic pole P1a of region 11a in magnetized region 11. Magnetic field line Mb on the lower surface of magnet 10 in the figure is extended from magnetic pole P1b of region 11b in magnetized region 11 to magnetic pole P2b of region 12b in magnetized region 12. Magnetic field line Mc1 on the left side of magnet 10 in the figure is extended from region 11b to region 11a in magnetized region 11. Magnetic field line Mc2 on the right side of magnet 10 in the figure is extended from region 12a to region 12b in magnetized region 12. Thus, the lateral spread of the magnetic field distribution of magnet 10 is limited.

Figure 9:
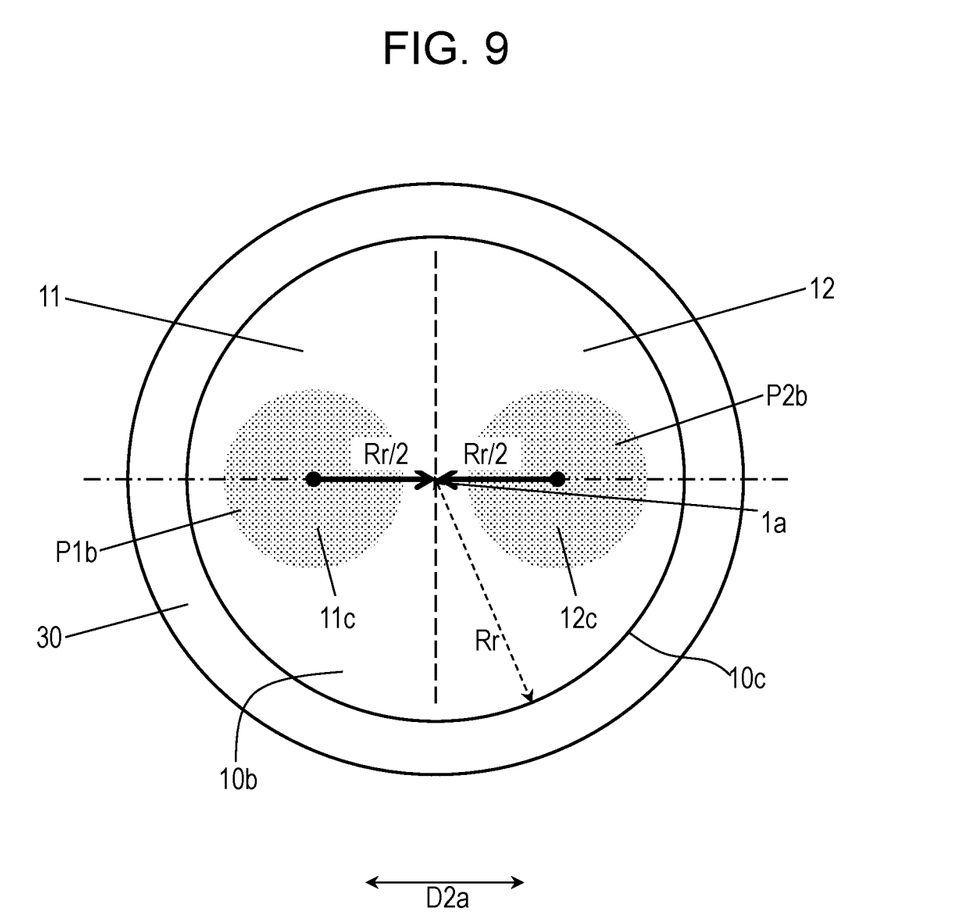
FIG. 9 illustrates a magnetic density distribution of a lower surface of the magnet according to the embodiment.

FIG. 9 illustrates the magnetic density distribution on lower surface 10b of magnet 10. As illustrated in FIG. 9, center 11c of magnetic pole P1b in magnetized region 11 is a portion at which the magnetic density in magnetic pole P1b in magnetized region 11 is highest. Center 12c of magnetic pole P2b in magnetized region 12 is a portion at which the magnetic density in magnetic pole P2b in magnetized region 12 is highest. Center 11c of magnetic pole P1b is thus located at a distance of a half of radius Rr of lower surface 10b of magnet 10 from the center of lower surface 10b of magnet 10 in arrangement direction D2a in which magnetized regions 11 and 12 are arranged. Center 12c is thus located at a distance of a half of radius Rr from the center of lower surface 10b in arrangement direction D2a.

Figure 10:
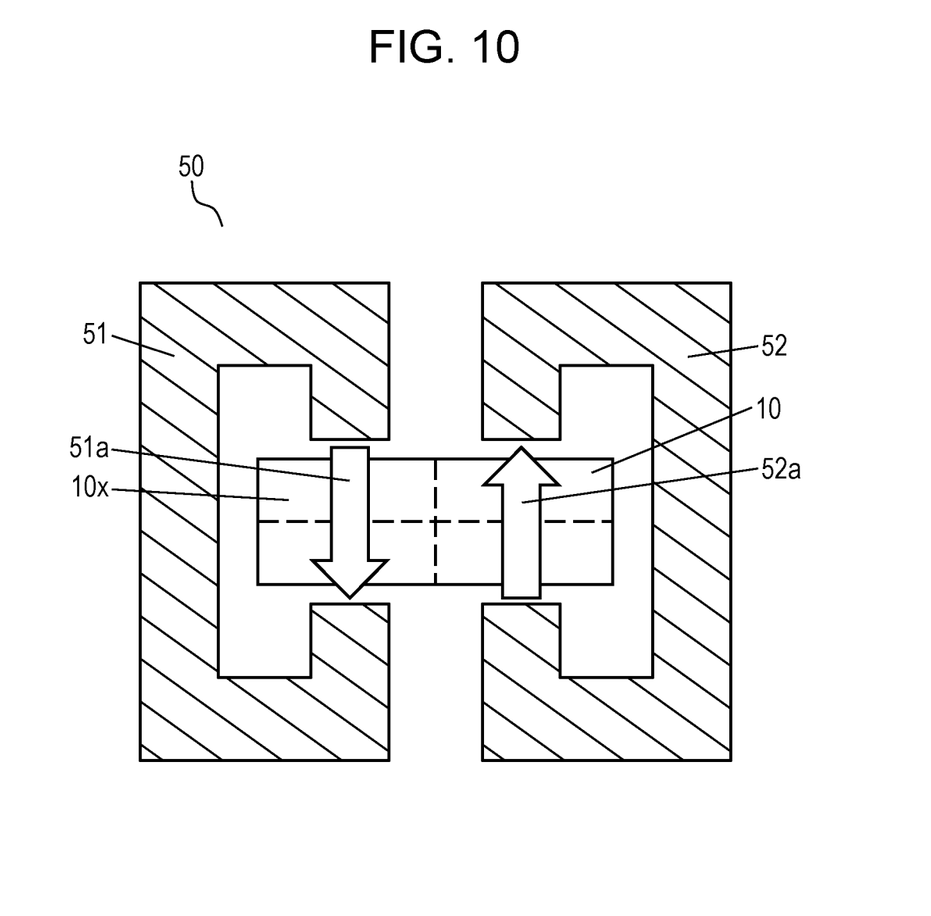
FIG. 10 illustrates a method for magnetizing the magnet according to the embodiment.

FIG. 10 schematically illustrates a method for magnetizing magnet 10. Magnetic body 10x obtained by shaping a magnetic material, such as a ferrite, into a disc shape is magnetized, thereby magnetizing magnet 10. Magnetization device 50 includes magnetizer 51 and magnetizer 52. Magnetizer 51 on the left side in the figure is configured to apply downward magnetic field 51a to the left half of magnetic body 10x. Magnetizer 52 on the right side in the figure is configured to apply upward magnetic field 52a to the right half of magnetic body 10x. Magnetic body 10x is magnetized with magnetization device 50, and provides magnet 10 having the polarities illustrated in FIG. 7.

Figure 11:
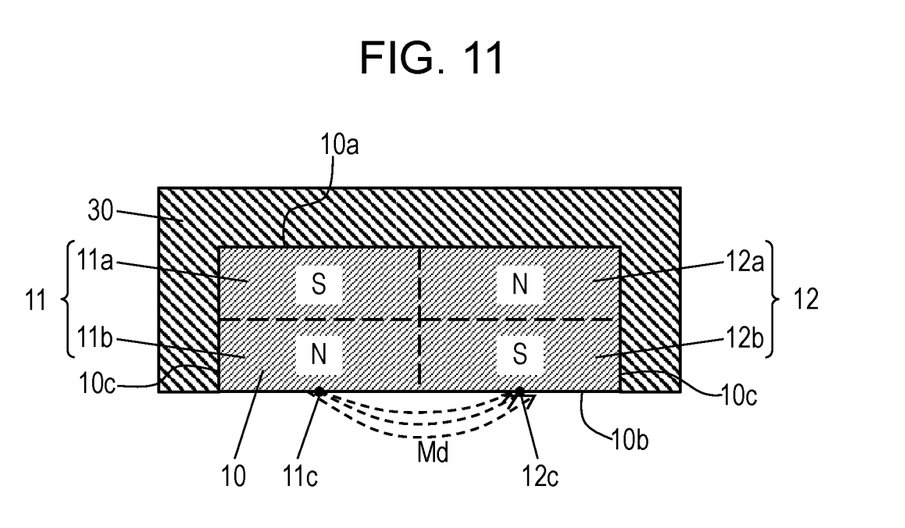
FIG. 11 illustrates a magnetic field distribution of the magnet with a yoke attached thereto according to the embodiment.

FIG. 11 illustrates the magnetic field distribution of magnet 10 with magnetic yoke 30 attached thereto. Magnetic yoke 30 is made of ferromagnetic material, such as pure iron. Magnetic yoke 30 covers the entirety of upper surface 10a and side surface 10c of magnet 10 and contacts upper surface 10a and side surface 10c. In other words, magnetic yoke 30 covers the outer surface of magnet 10 except lower surface 10b of magnet 10 facing magnetic sensor 20. Magnet 10 covered by magnetic yoke 30 allows the magnetic field of the covered portion to pass through magnetic yoke 30, reducing the spread of the magnetic field. Target magnetic field Md has high magnetic flux density on lower surface 10b on which magnet 10 is exposed. For example, magnet 10 with magnetic yoke 30 attached thereto and magnet 10 with no magnetic yoke 30 attached thereto are compared in terms of the magnetic field strength in a detection region of a two-pole magnet with no magnetic yoke 30 attached thereto. In the detection region located 3 mm away from the magnet, the magnetic field strength of magnet 10 with magnetic yoke 30 attached thereto is about 120 mT. The magnetic field strength of magnet 10 with no magnetic yoke attached thereto is about 90 mT. The magnetic field strength of a two-pole magnet with no magnetic yoke 30 attached thereto is about 40 mT. Magnet 10 with magnetic yoke 30 attached thereto according to the present disclosure thus applies large target magnetic field Md to magnetic sensor 20.

When the magnetic field strength of target magnetic field Md which is applied to magnetic sensor 20 increases, the effects of disturbance magnetic fields become relatively small. As a result, magnetic sensor 20 detects magnetic field accurately at a high large S/N ratio. Due to an increase in target magnetic field Md, magnetic sensor 20 may be implemented preferably by an anisotropic magnetoresistor.

Figure 12:
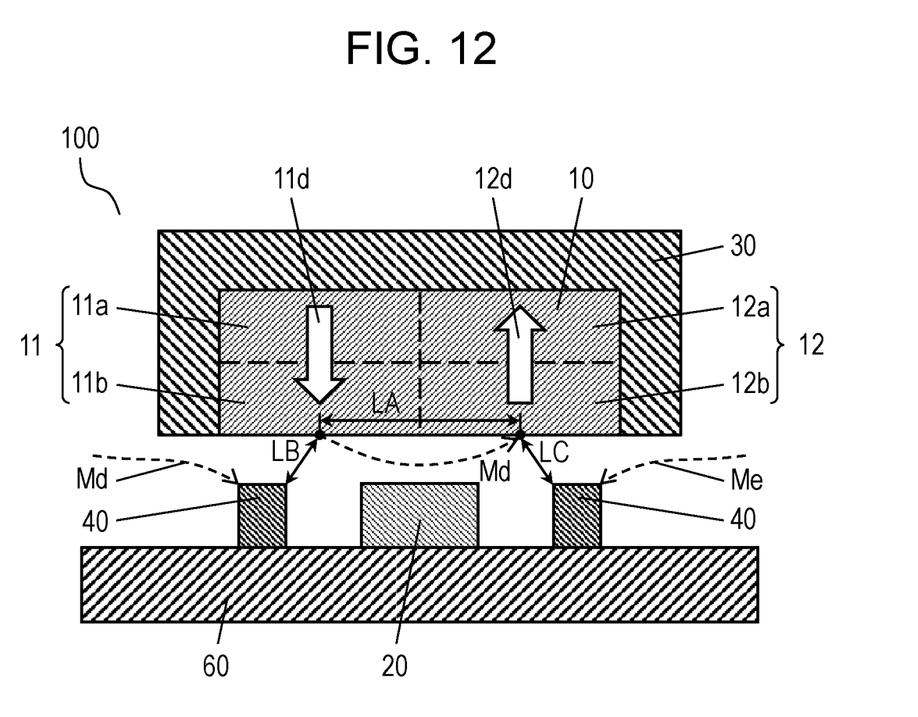
FIG. 12 is an enlarged cross-sectional view of the magnetic sensor unit illustrated in FIG. 1.

Magnetic shield 40 is made of ferromagnetic material, such as pure iron. Magnetic shield 40 surrounds magnetic sensor 20 in lateral direction D2 crossing up and down directions D1 of the magnetic sensor 20 perpendicularly. Magnetic shield 40 has a ring shape surrounding magnetic sensor 20 when viewed from above. FIG. 12 is an enlarged cross-sectional view of magnetic sensor unit 100. Center 11c of magnetic pole P1b in magnetized region 11 is located at distance LA from center 12c of magnetic pole P2b in magnetized region 12. Center 11c of magnetic pole P1b in magnetized region 11 is located at distance LB from magnetic shield 40. Center 12c of magnetic pole P2b in magnetized region 12 is located at distance LC from magnetic shield 40. In magnetic sensor unit 100, distances LA, LB, LC satisfy the relation of LA<LB+LC. The positional relation of magnet 10 and magnetic shield 40 reduces the size of magnetic shield 40.

Specifically, target magnetic field Md of magnetic sensor unit 100 is extended from center 11c of the magnetic pole to center 12c of the magnetic pole, as illustrated in FIG. 11. The detection region in which target magnetic field Md is formed is formed in the air, and thus the magnetic permeability of the detection region is 1. Meanwhile, magnetic shield 40 is made of ferromagnetic material and the magnetic permeability thereof exceeds 1000. Therefore, the effects of the magnetoresistance of magnetic shield 40 can be ignored. Thus, the magnetoresistance of the air from center 11c of magnetic pole P1b to center 12c of magnetic pole P2b is lower than the magnetoresistance of the air from center 11c of magnetic pole P1b to center 12c of magnetic pole P2b via magnetic shield 40. Accordingly, the magnetic saturation of magnetic shield 40 due to the magnetic field formed by magnet 10 is reduced; thus, it is possible to reduce the radial size of magnetic shield 40. Specifically, when the aforementioned relationship LA<LB+LC is satisfied, the outer peripheral edge of magnetic shield 40 can be placed inward of the outer peripheral edge of magnetic yoke 30 when viewed from above, as illustrated in FIG. 1.

A gap may be provided between magnetic shield 40 and magnet 10, but has no impact on the detection region since external magnetic field Me is absorbed by magnetic shield 40 and magnetic yoke 30 which have high magnetic permeability.

Magnetic shield 40 with a small size as described above allows magnetic sensor 20 and magnetic shield 40 to be mounted onto base substrate 60. This configuration reduces variations in the distance between magnetic sensor 20 and magnetic shield 40. When plural magnetic sensor units 100 are assembled, variations in the detection accuracy of individual magnetic sensor units 100 can be reduced.

The magnetic yoke disclosed in PTL 1 is made of ferromagnetic metal and thus produces the advantageous effect of strengthening the target magnetic field. However, magnetic saturation occurs in this magnetic yoke due to the magnetic field of the magnet, therefore not providing the magnetic shield effects. The shield case disclosed in PTL 2 is necessarily spaced apart from a detection magnet in order to reduce the effects on the magnetic field of the magnet, accordingly increasing the size of the device.

A variation of magnetic sensor unit 100 will be described below.

Variation

Figure 13:
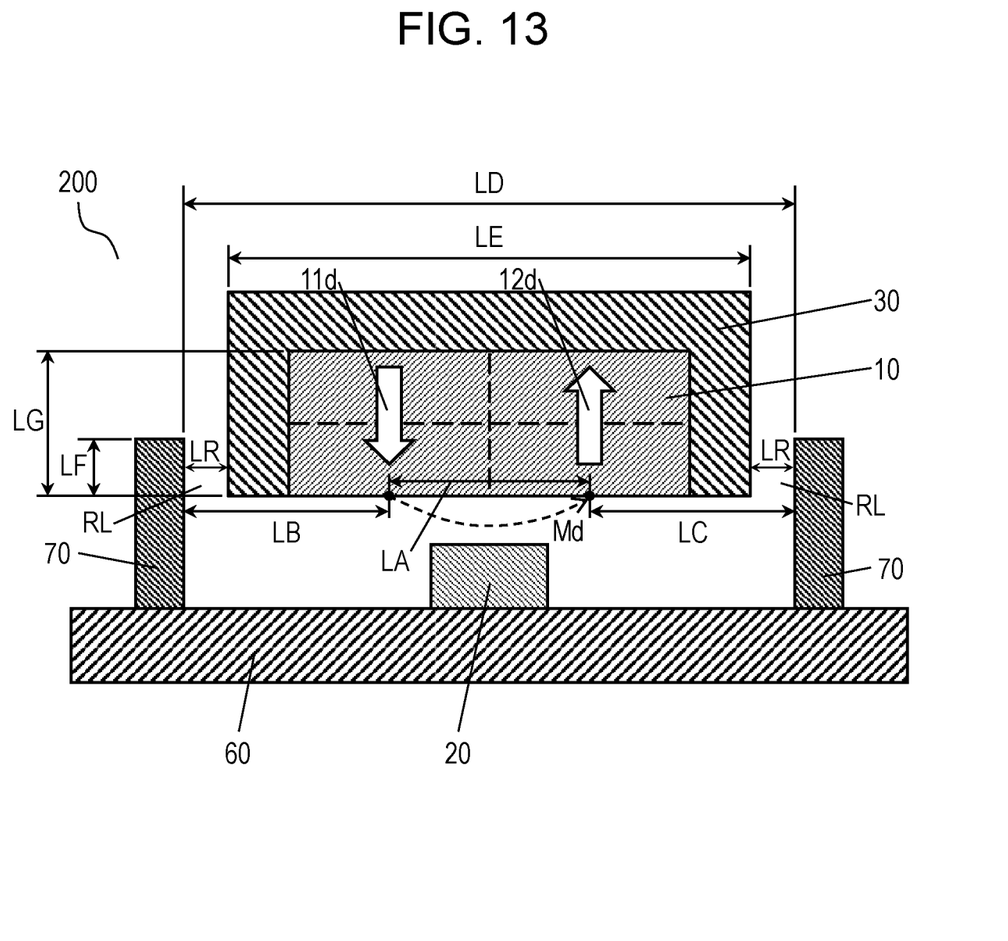
FIG. 13 is an enlarged cross-sectional view of another magnetic sensor unit according to the embodiment.

FIG. 13 is an enlarged cross-sectional view of another magnetic sensor unit 200 which is a variation of the sensor unit according to the embodiment. In FIG. 13, components identical to those of magnetic sensor unit 100 illustrated in FIGS. 1 to 12 are denoted by the same reference numerals, and description thereof will be simplified. Magnetic sensor unit 200 includes magnetic shield 70 instead of magnetic shield 40 of magnetic sensor unit 100, and the structures other than magnetic shield 70 are the same as those of magnetic sensor unit 100.

The inner diameter of magnetic shield 70 of magnetic sensor unit 200 is greater than the outer diameter of magnetic yoke 30, and magnetic shield 70 surrounds the outer periphery of magnetic yoke 30 when viewed from above. The upper edge of magnetic shield 70 is located higher than the lower edge of magnetic yoke 30. In other words, in magnetic sensor unit 200, the detection region is surrounded by magnetic shield 70. Portion RL at which the width between magnetic shield 70 and magnetic yoke 30 facing each other is locally narrow forms a labyrinth structure. The labyrinth structure formed by magnetic shield 70 and magnetic yoke 30 prevents dust, such as iron powder, from entering the detection region from the space outside magnetic sensor unit 200.

In the structure that magnetic yoke 30 is surrounded by magnetic shield 70, if distance LR between the inner periphery of magnetic shield 70 and the outer periphery of magnetic yoke 30 is long, the dust-proof effect is reduced. If distance LR is short, it is difficult to assemble magnetic sensor unit 200. The inner diameter LD of magnetic shield 70, the outer diameter LE of magnetic yoke 30, a height difference LF between the lower edge of magnetic yoke 30 and the upper edge of magnetic shield 70 in up and down directions D1, and the height LG of magnet 10 in up and down directions D1 satisfying the following two relations: $LE \times 1.5 > LD > LE \times 1.2$ and $LG \times 0.5 > LF > 0$ provide both the dust-proof effect and the ease of assembly.

In the structure of magnetic shield 70, the relation LA<LB+LC explained in the description of magnetic sensor unit 100 is satisfied, reducing the magnetic saturation of magnetic shield 70. Furthermore, the magnetic fields on upper surface 10a and side surface 10c of magnet 10 which contact magnetic yoke 30 are confined in magnetic yoke 30, as illustrated in FIG. 11. Therefore, the magnetic saturation of magnetic shield 70 is reduced unless magnetic shield 70 contacts magnetic yoke 30.

In the embodiment, terms, such as "upper surface", "lower surface", and down directions", and "viewed from above", indicating directions represent relative directions determined only by the relative positional relationship of components, such as the magnet and the magnetic sensor, of the magnetic sensor unit, and do not represent absolute directions, such as a vertical direction.

INDUSTRIAL APPLICABILITY

A magnetic sensor unit according to the present disclosure has magnetic shielding properties and has a small size, and is effectively used as an in-vehicle magnetic sensor unit.

REFERENCE MARKS IN THE DRAWINGS 1 rotation shaft
1a rotation axis
10 magnet
11, 12 magnetized region
20 magnetic sensor
30 magnetic yoke
40, 70 magnetic shield
60 base substrate
100, 200 magnetic sensor unit
P1a, P1b, P2a, P2b magnetic pole
MR1-MR8 magnetoresistor
BR1, BR2 bridge circuit
BR1a, BR1b, BR2a, BR2b series assembly

The invention claimed is:
1. A magnetic sensor unit comprising:
a magnet having an upper surface, a lower surface, and a side surface connected to the upper surface and the lower surface;
a magnetic sensor facing the lower surface of the magnet;
a magnetic shield surrounding the magnetic sensor in a lateral direction crossing up and down directions of the magnetic sensor; and
a magnetic yoke covering the upper surface and the side surface of the magnet, wherein:

the magnetic sensor includes an anisotropic magnetoresistor configured to have a target magnetic field generated by the magnet applied thereto, the magnet includes:

a first magnetized region magnetized along the up and down direction and having a first magnetic pole provided on the lower surface of the magnet; and a second magnetized region magnetized in a direction opposite to a direction of magnetization of the first magnetized region and having a second magnetic pole provided on the lower surface of the magnet, a distance LA between a center of the first magnetic pole and a center of the second magnetic pole, a distance LB between the magnetic shield and the center of the first magnetic pole, a distance LC between the magnetic shield and the center of the second magnetic pole satisfy a relation of LA<LB+LC, and an outer peripheral edge of the magnetic shield is located inward of an outer peripheral edge of the magnetic yoke when viewed from above.

2. The magnetic sensor unit of claim 1, wherein an outer peripheral edge of the magnetic shield is located outward of an outer peripheral edge of the magnetic yoke when viewed from above, and an upper edge of the magnetic shield is located higher than a lower edge of the magnetic yoke.

3. The magnetic sensor unit of claim 2, wherein is an inner diameter LD of the magnetic shield, an outer diameter LE of the magnetic yoke, a height difference LF between the lower edge of the magnetic yoke and the upper edge of the magnetic shield in the up and down directions, and a height LG of the magnet satisfy relations of LE×1.5>LD>LE×1.2, and LG×0.5>LF>0.

4. The magnetic sensor unit of claim 1, further comprising a base substrate connected to the magnetic sensor and the magnetic shield.

5. The magnetic sensor unit of claim 1, wherein the magnet is rotatable about a rotation axis extended along the up and down directions.

6. The magnetic sensor unit of claim 1, wherein the magnetic yoke contacts the upper surface and the side surface of the magnet.

7. The magnetic sensor unit of claim 1, wherein the magnet is connected to a tip of a rotation shaft.

8. A magnetic sensor unit comprising:

a magnet having an upper surface, a lower surface, and a side surface connected to the upper surface and the lower surface;

a magnetic sensor facing the lower surface of the magnet;

a magnetic shield surrounding the magnetic sensor in a lateral direction crossing up and down directions of the magnetic sensor; and a magnetic yoke covering the upper surface and the side surface of the magnet, wherein:

the magnetic sensor includes an anisotropic magnetoresistor configured to have a target magnetic field generated by the magnet applied thereto, the magnet includes:

a first magnetized region magnetized along the up and down direction and having a first magnetic pole provided on the lower surface of the magnet; and a second magnetized region magnetized in a direction opposite to a direction of magnetization of the first magnetized region and having a second magnetic pole provided on the lower surface of the magnet, a distance LA between a center of the first magnetic pole and a center of the second magnetic pole, a distance LB between the magnetic shield and the center of the first magnetic pole, a distance LC between the magnetic shield and the center of the second magnetic pole satisfy a relation of LA<LB+LC, an outer peripheral edge of the magnetic shield is located outward of an outer peripheral edge of the magnetic yoke when viewed from above, an upper edge of the magnetic shield is located higher than a lower edge of the magnetic yoke, and an inner diameter LD of the magnetic shield, an outer diameter LE of the magnetic yoke, a height difference LF between the lower edge of the magnetic yoke and the upper edge of the magnetic shield in the up and down directions, and a height LG of the magnet satisfy relations of LE×1.5>LD>LE×1.2, and LG×0.5>LF>0.

9. The magnetic sensor unit of claim 8, further comprising a base substrate connected to the magnetic sensor and the magnetic shield.

10. The magnetic sensor unit of claim 8, wherein the magnet is rotatable about a rotation axis extended along the up and down directions.

11. The magnetic sensor unit of claim 8, wherein the magnetic yoke contacts the upper surface and the side surface of the magnet.

12. The magnetic sensor unit of claim 8, wherein the magnet is connected to a tip of a rotation shaft.

* * * * *